(12) United States Patent
Lee et al.

(10) Patent No.: US 12,671,945 B2
(45) Date of Patent: Jun. 30, 2026

(54) PIEZOELECTRIC DEVICE, METHOD OF MANUFACTURING THE SAME, AND APPARATUS INCLUDING THE PIEZOELECTRIC DEVICE

(71) Applicant: LG Display Co., Ltd., Seoul (KR)

(72) Inventors: HwaYoul Lee, Paju-si (KR); Sooyoun Kim, Paju-si (KR); YongWoo Lee, Paju-si (KR); Uihyeon Jeong, Paju-si (KR); Daesu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 125 days.

(21) Appl. No.: 18/754,438

(22) Filed: Jun. 26, 2024

(65) Prior Publication Data

US 2025/0024206 A1     Jan. 16, 2025

(30) Foreign Application Priority Data

Jul. 10, 2023     (KR) ........................ 10-2023-0089196

(51) Int. Cl.
| | |
|---|---|
| *H04R 17/00* | (2006.01) |
| *H04R 31/00* | (2006.01) |
| *H10N 30/092* | (2023.01) |
| *H10N 30/85* | (2023.01) |

(52) U.S. Cl.
CPC ............. *H04R 17/00* (2013.01); *H04R 31/00* (2013.01); *H10N 30/092* (2023.02); *H10N 30/852* (2023.02)

(58) Field of Classification Search
CPC .... H04R 17/00; H04R 31/00; H04R 2499/15; H10N 30/092; H10N 30/852
USPC ................................................... 381/190, 388
See application file for complete search history.

(56) References Cited

U.S. PATENT DOCUMENTS

| | | | | |
|---|---|---|---|---|
| 8,712,079 B2* | 4/2014 | Kim | ....................... | H04R 17/00 |
| | | | | 381/354 |
| 2018/0193879 A1* | 7/2018 | Morita | ....................... | C08J 3/24 |
| 2020/0212117 A1* | 7/2020 | Jeon | ....................... | H10W 90/00 |
| 2021/0173487 A1* | 6/2021 | Ham | ....................... | H04R 1/028 |

FOREIGN PATENT DOCUMENTS

| | | | | | |
|---|---|---|---|---|---|
| EP | | 2832297 A1 * | 2/2015 | ............. | H04R 17/00 |
| KR | 10-2302848 B1 | | 9/2021 | | |

* cited by examiner

*Primary Examiner* — Sean H Nguyen
(74) *Attorney, Agent, or Firm* — Seed Intellectual Property Law Group LLP

(57)     ABSTRACT

A vibration device according to one or more example aspects of the present disclosure may comprise a first electrode layer, a second electrode layer, and a piezoelectric layer between the first electrode layer and the second electrode layer. The piezoelectric layer may include a plurality of grooves.

12 Claims, 7 Drawing Sheets

A-A'

B-B'

Prepare matrix material —— S100

Prepare slurry —— S200

Mold —— S300

Sinter —— S400

Form elecrode —— S500

Weigh —— S110

Mix —— S120

Calcine —— S130

Mill —— S140

Dry —— S150

| | |
|---|---|
| Weigh | — S210 |
| Dry | — S220 |
| Form surry | — S230 |

PIEZOELECTRIC DEVICE, METHOD OF MANUFACTURING THE SAME, AND APPARATUS INCLUDING THE PIEZOELECTRIC DEVICE

CROSS-REFERENCE TO RELATED APPLICATION

This application claims the benefit of the Korean Patent Application No. 10-2023-0089196 filed on Jul. 10, 2023, which is hereby incorporated by reference as if fully set forth herein.

BACKGROUND

Technical Field

The present disclosure relates to a piezoelectric device, a method of manufacturing the same, and an apparatus including the piezoelectric device.

Description of the Related Art

Recently, the demands for slimmer and thinner electronic devices are increasing. In speakers applied to electronic devices, piezoelectric devices capable of being implemented with a thin thickness are attracting much attention instead of voice coils, based on the demands for slimmer and thinner devices.

BRIEF SUMMARY

Speakers or vibration apparatuses that include a piezoelectric device may be supplied with a driving power or a driving signal through a signal cable and may be driven or may vibrate.

The inventors have performed extensive research and experiments for implementing a piezoelectric device where a structure and a manufacturing process are simplified. The inventors have invented a piezoelectric device having a new structure, a method of manufacturing the same, and an apparatus including the piezoelectric device, in which a manufacturing process of the piezoelectric device is simplified and the sound pressure characteristics of piezoelectric device is improved, based on the extensive research and experiments.

One or more aspects of the present disclosure are directed to providing a piezoelectric device, a method of manufacturing the same, and an apparatus including the piezoelectric device, in which a manufacturing process is simplified.

One or more aspects of the present disclosure are directed to providing a piezoelectric device, a method of manufacturing the same, and an apparatus including the piezoelectric device, which may enhance a sound pressure level characteristic of a sound.

Additional features, advantages, and aspects of the present disclosure are set forth in the present disclosure and will also be apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the appended drawings.

A piezoelectric device according to an aspect of the present disclosure may include a first electrode layer, a second electrode layer, and a piezoelectric layer between the first electrode layer and the second electrode layer. The piezoelectric layer may include a plurality of grooves.

A method of manufacturing a piezoelectric device according to an aspect of the present disclosure may include preparing a matrix material, preparing a slurry using the matrix material, molding the slurry to prepare a molding element having a plurality of grooves, sintering the molding element to prepare a piezoelectric layer, and forming an electrode layer on the piezoelectric layer.

An apparatus according to an aspect of the present disclosure may include a vibration member, and a vibration device configured to vibrate the vibration member. The vibration device may include the piezoelectric device including a first electrode layer, a second electrode layer, and a piezoelectric layer between the first electrode layer and the second electrode layer. The piezoelectric layer may include a plurality of grooves.

According to an aspect of the present disclosure, process optimization may be achieved by simplifying the manufacturing process.

According to an aspect of the present disclosure, a piezoelectric device and apparatus can be molded to fit the shape of the surface to which they are applied, and thus, the piezoelectric device may be easily applied to various apparatuses.

According to an aspect of the present disclosure, since a piezoelectric device and apparatus have strong piezoelectric properties, the piezoelectric device may be driven by low driving voltages to improve piezoelectric properties of the piezoelectric device.

It is to be understood that both the foregoing general description and the following detailed description of the present disclosure are exemplary and explanatory and are intended to provide further explanation of the disclosure.

BRIEF DESCRIPTION OF THE SEVERAL VIEWS OF THE DRAWINGS

The accompanying drawings, which are included to provide a further understanding of the disclosure, and are incorporated in and constitute a part of this application, illustrate aspects of the disclosure and together with the description serve to explain the principle of the disclosure.

DETAILED DESCRIPTION

Figure 1:
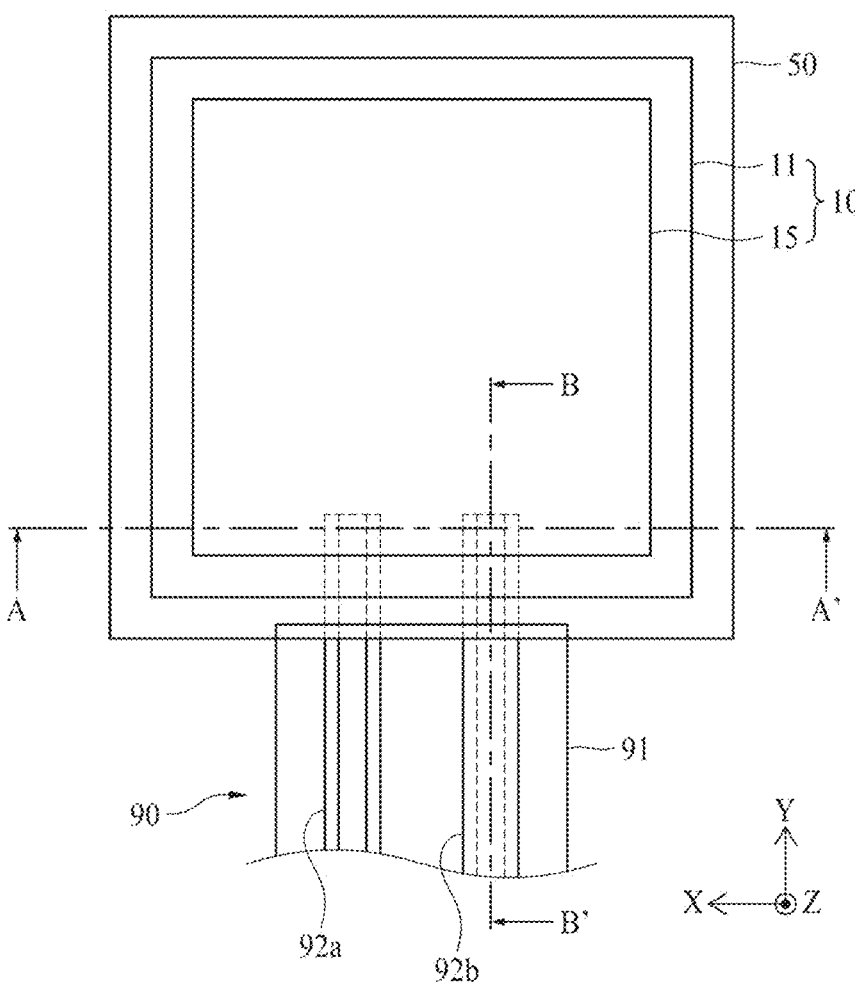
FIG. 1 illustrates a vibration apparatus according to an aspect of the present disclosure.

Reference is now made in detail to aspects of the present disclosure, examples of which may be illustrated in the accompanying drawings. In the following description, when a detailed description of well-known methods, functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the aspects described with reference to the accompanying drawings. The present disclosure may, however, be embodied in different forms and should not be construed as limited to the aspects set forth herein. Rather, these aspects are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When a term like "comprise," "have," "include," "contain," "constitute," "made of," "formed of," "composed of," or the like is used with respect to one or more elements (e.g., layers, films, regions, components, sections, members, parts, regions, areas, portions, steps, operations, and/or the like), one or more other elements may be added unless a term such as "only" or the like is used. The terms used in the present disclosure are merely used in order to describe particular example aspects, and are not intended to limit the scope of the present disclosure. The terms of a singular form may include plural forms unless the context clearly indicates otherwise.

The word "exemplary" is used to mean serving as an example or illustration. Aspects are example aspects. In one or more implementations, "aspects," "examples," and the like should not be construed to be preferred or advantageous over other implementations. An aspect, an example, an example aspect, or the like may refer to one or more aspects, one or more examples, one or more example aspects, or the like, unless stated otherwise. Further, the term "may" encompasses all the meanings of the term "can."

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship, when the positional relationship between two parts is described, for example, using "on," "over," "under," "above," "below," "beneath," "near," "close to," "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements (e.g., layers, films, regions, components, sections, members, parts, regions, areas, portions, steps, operations, and/or the like), these elements should not be limited by these terms. These terms are only used to distinguish one element from another. For example, a first element may denote a second element, and, similarly, a second element may denote a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these are not used to define the essence, basis, sequence, order, or number of the elements.

For the expression that an element or layer is "connected," "coupled," "attached," or "adhered" to another element or layer, the element or layer can not only be directly connected, coupled, attached, or adhered to another element or layer, but also be indirectly connected, coupled, attached, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally.

The term "at least one" should be understood as including any and all combinations of one or more of the associated listed items. For example, the meaning "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

Features of various aspects of the present disclosure may be partially or entirely coupled to or combined with each other, may be technically associated with each other, and may be operated, linked, or driven together in various ways. Aspects of the present disclosure may be implemented or carried out independently from each other, or may be implemented or carried out together in a co-dependent or related relationship. In one or more aspects, the components of each apparatus according to various aspects of the present disclosure are operatively coupled and configured.

Unless otherwise defined, the terms (including technical and scientific terms) used herein have the same meaning as commonly understood by one of ordinary skill in the art to which example aspects belong. It should be further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example aspects of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may be different from an actual scale, dimension, size, and thickness, and thus, aspects of the present disclosure are not limited to a scale, dimension, size, and thickness illustrated in the drawings.

Figure 2:
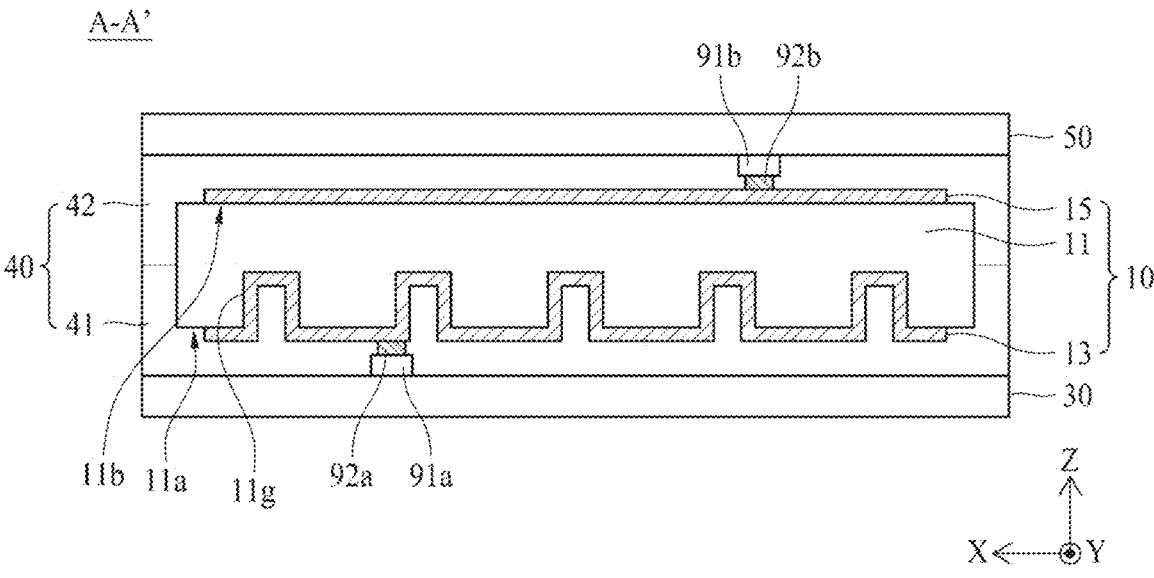
FIG. 2 is a cross-sectional view taken along line A-A' illustrated in FIG. 1 according to an aspect of the present disclosure.
Figure 3:
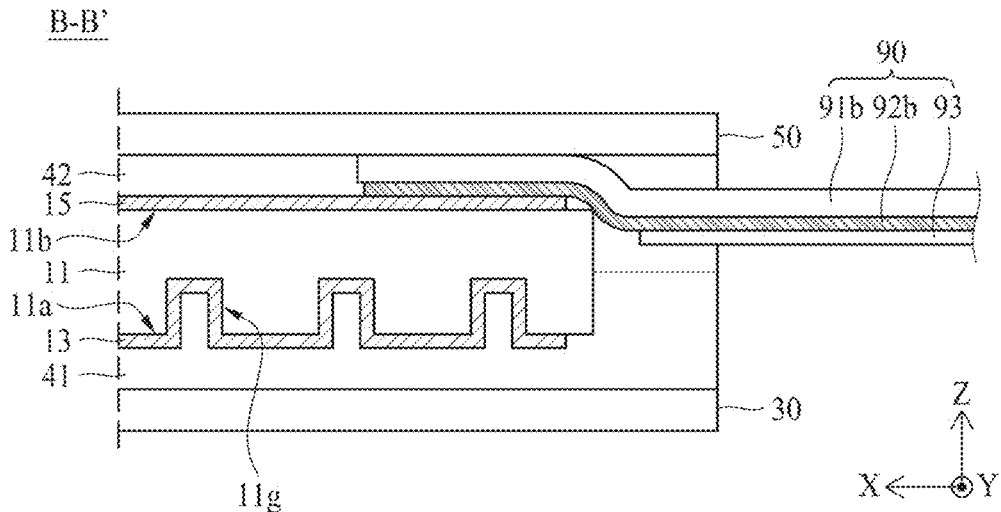
FIG. 3 is a cross-sectional view taken along line B-B' illustrated in FIG. 1 according to an aspect of the present disclosure.

FIG. 1 illustrates a vibration apparatus according to an aspect of the present disclosure. FIG. 2 is a cross-sectional view taken along line A-A' illustrated in FIG. 1 according to an aspect of the present disclosure. FIG. 3 is a cross-sectional view taken along line B-B' illustrated in FIG. 1 according to an aspect of the present disclosure.

Referring to FIGS. 1 to 3, a vibration apparatus according to an example aspect of the present disclosure may include a vibration generating part 10, a first cover member 30, a second cover member 50, and a signal cable 90.

The vibration generating part 10 may include at least one or more vibration parts. For example, the vibration generating part 10 according to an example aspect of the present disclosure may have a single-layer structure and may include one vibration part. For example, the vibration generating part 10 may be a piezoelectric device, a vibration device, or a vibration part, but aspects of the present disclosure are not limited thereto.

The vibration generating part 10 may include a piezoelectric device or a piezoelectric material (or an electroactive material) having a piezoelectric effect. For example, the vibration generating part 10 may be a piezoelectric device. For example, the piezoelectric material (or the piezoelectric device) may have a characteristic where pressure or twisting is applied to a crystal structure by an external force, a potential difference occurs due to dielectric polarization caused by a relative position change of a positive (+) ion and a negative (−) ion, and a vibration is generated by an electric field based on a voltage applied thereto.

The vibration generating part 10 may include a piezoelectric layer 11, a first electrode layer 13, and a second electrode layer 15.

The piezoelectric layer 11 may be provided between the first electrode layer 13 and the second electrode layer 15. The piezoelectric layer 11 may include a piezoelectric material (or an electroactive material) having a piezoelectric effect. The piezoelectric layer 11 may include a ceramic-based material for implementing a relatively strong vibration, or may include piezoelectric ceramic having a perovskite-based crystal structure. For example, the piezoelectric layer 11 may be a piezoelectric device layer, a piezoelectric material layer, a piezoelectric ceramic layer, a vibration layer, or a displacement layer, but aspects of the present disclosure are not limited thereto.

For example, the piezoelectric ceramic constituting the piezoelectric layer 11 may include single-crystal ceramic having a single-crystal structure, or may include a ceramic material or poly-crystal ceramic having a poly-crystal structure. A piezoelectric material including single-crystal ceramic may include one or more of aluminum phosphate (for example, berlinite and $\alpha$-AlPO$_4$), silicon dioxide (for example, $\alpha$-SiO$_2$), lithium niobate (LiNbO$_3$), terbium molydbate (Tb$_2$(MoO$_4$)$_3$), lithium tetraborate (Li$_2$B$_4$O$_7$), ZnO or a combination thereof. The piezoelectric material including single-crystal ceramic may include a lead zirconate titanate (PZT)-based material including lead (Pb), zirconium (Zr), and titanium (Ti) or may include a lead zirconate nickel niobate (PZNN)-based material including lead (Pb), zirconium (Zr), nickel (Ni), and niobium (Nb), but aspects of the present disclosure are not limited thereto. As another example, the piezoelectric layer 11 may include at least one of CaTiO$_3$, BaTiO$_3$, and SrTiO$_3$ without lead (Pb), but aspects of the present disclosure are not limited thereto.

The first electrode layer 13 may be disposed at a first surface (or a lower surface) of the piezoelectric layer 11. The first electrode layer 13 may have the same size as that of the piezoelectric layer 11, or may have a size which is less than that of the piezoelectric layer 11. For example, the first electrode layer 13 may include a single-electrode shape. For example, the first electrode layer 13 may have a tetragonal shape. For example, an end (or a lateral surface or a side surface or a portion) of the first electrode layer 13 may be spaced apart from an end (or a lateral surface or a side surface or a portion) of the piezoelectric layer 11, and thus, an electrical connection (or short circuit) between the first electrode layer 13 and the second electrode layer 15 may be prevented.

A first signal line 92*a* may be configured at a lower surface (or under) of the first electrode layer 13. The first electrode layer 13 may be in contact with the first signal line 92*a*. The first electrode layer 13 may be electrically connected to the first signal line 92*a*.

The second electrode layer 15 may be disposed at a second surface (or an upper surface), which is different from or opposite to the first surface, of the piezoelectric layer 11. The second electrode layer 15 may have the same size as that of the piezoelectric layer 11, or may have a size which is less than that of the piezoelectric layer 11. For example, the second electrode layer 15 may include a single-electrode shape. For example, the second electrode layer 15 may have a tetragonal shape. For example, an end (or a lateral surface or a side surface or a portion) of the second electrode layer 15 may be spaced apart from an end (or a lateral surface or a side surface or a portion) of the piezoelectric layer 11, and thus, an electrical connection (or short circuit) between the second electrode layer 15 and the first electrode layer 13 may be prevented.

A second signal line 92*b* may be provided on an upper surface of the second electrode layer 15. The second electrode layer 15 may contact the second signal line 92*b*. The second electrode layer 15 may be electrically connected to the second signal line 92*b*.

One or more of the first electrode layer 13 and the second electrode layer 15 according to an example aspect of the present disclosure may include a transparent conductive material, a semitransparent conductive material, or an opaque conductive material. For example, the transparent or semitransparent conductive material may include one or more of indium tin oxide (ITO) or indium zinc oxide (IZO), but aspects of the present disclosure are not limited thereto. The opaque conductive material may include one or more of gold (Au), silver (Ag), platinum (Pt), palladium (Pd), molybdenum (Mo), magnesium (Mg), carbon, or glass frit-including silver (Ag), or an alloy thereof, but aspects of the present disclosure are not limited thereto. According to another example aspect of the present disclosure, each of the first electrode layer 13 and the second electrode layer 15 may include silver (Ag) having a low resistivity, so as to enhance an electrical characteristic and/or a vibration characteristic of the piezoelectric layer 11. For example, carbon may be a carbon material including carbon black, ketjen black, carbon nanotube, and graphite, but aspects of the present disclosure are not limited thereto.

According to other aspects of the present disclosure, each of the first electrode layer 13 and the second electrode layer 15 may include silver (Ag) with a low specific resistivity to enhance the electrical and/or vibrational properties of the piezoelectric layer 11.

In the first electrode layer 13 and the second electrode layer 15 including glass frit-including silver (Ag), a content of glass frit may be about 1 wt % or more to about 12 wt % or less, but aspects of the present disclosure are not limited thereto. The glass frit may include a material based on PbO or Bi$_2$O$_3$, but aspects of the present disclosure are not limited thereto.

The piezoelectric layer 11 may be polarized (or poling) by a certain voltage applied to the first electrode layer 13 and the second electrode layer 15 in a certain temperature atmosphere or a temperature atmosphere which is changed from a high temperature to a room temperature, but aspects of the present disclosure are not limited thereto. For example, the piezoelectric layer 11 may alternately repeat contraction and/or expansion based on an inverse piezoelectric effect based on a sound signal (or a voice signal) applied to the first electrode layer 13 and the second electrode layer 15 from the outside, and thus, may vibrate. For example, the piezoelectric layer 11 may vibrate based on a vertical-direction vibration and a horizontal-direction vibration by the first electrode layer 13 and the second electrode layer 15. A displacement (or vibration or driving) of a vibration member may increase based on the horizontal-direction contraction and/or expansion of the vibration layer, and thus, a vibration of a vibration apparatus may be further enhanced.

The vibration generating part 10 or piezoelectric layer 11 according to an aspect of the present disclosure may further include a plurality of grooves 11*g*. The plurality of grooves 11*g* may be configured in the piezoelectric layer 11. For example, the plurality of grooves 11*g* may be concavely configured in (or at) the piezoelectric layer 11. The plurality of grooves 11*g* may be concavely configured from one surface (or one side) of the piezoelectric layer (11) to have a polygonal cross-section. For example, each of the plurality of grooves 11*g* may include a polygonal cross-sectional structure having a rectangular or square shape, a curved cross-sectional structure, or a dome-shaped cross-sectional structure, but aspects of the present disclosure are not limited thereto. Each of the plurality of grooves 11*g* may be a concave prat, a groove part, a slit part, or a trench, but aspects of the present disclosure are not limited thereto.

According to an aspect of the present disclosure, the piezoelectric layer 11 may include a first surface 11*a*, and a second surface 11*b* opposite the first surface 11*a*. The plurality of grooves 11*g* may be formed on any one of the first surface 11*a* and the second surface 11*b* of the piezoelectric layer 11. The plurality of grooves 11*g* may be concavely formed from any one of the first surface 11*a* and the second surface 11*b* of the piezoelectric layer 11. For example, the plurality of grooves 11*g* may be concavely formed from the first surface 11a of the piezoelectric layer 11 such that they have a polygonal cross-section. For example, the first surface 11a of the piezoelectric layer 11 including the plurality of grooves 11g may be a concave surface, a concave patterned surface, a curved surface, a non-planar surface, a concave part, a concave patterned part, a curved part, or a non-planar part, but aspects of the present disclosure are not limited thereto. For example, the second side 11b of the piezoelectric layer 11 may be a flat surface or a flat part, but aspects of the present disclosure are not limited thereto.

According to an aspect of the present disclosure, the first electrode layer 13 may be formed to cover the plurality of grooves 11g. The first electrode layer 13 may be formed to cover a first surface 11a of the piezoelectric layer 11 including the plurality of grooves 11g. The first electrode layer 13 may have a surface shape of the first surface 11a of the piezoelectric layer 11 that includes the plurality of grooves 11g. For example, the first electrode layer 13 may have a surface shape that closely follows the surface shape of the first surface 11a of the piezoelectric layer 11 including the plurality of grooves 11g. For example, the first electrode layer 13 may have a surface shape according to the surface shape of the first surface 11a of the piezoelectric layer 11 including the plurality of grooves 11g. The first electrode layer 13 may include a plurality of concave parts (or grooves) corresponding to each of the plurality of grooves 11g.

According to an aspect of the present disclosure, the plurality of grooves 11g may be configured between the piezoelectric layer 11 and the first electrode layer 13. The plurality of grooves 11g may be in direct contact with the first electrode layer 13. The contact area between the first electrode layer 13 and the piezoelectric layer 11 may be larger than the contact area between the second electrode layer 15 and the piezoelectric layer 11.

According to an aspect of the present disclosure, a part of the first electrode layer 13 may be inserted (or accommodated) into one surface (or one side) of the piezoelectric layer 11. A part of the first electrode layer 13 may be inserted (or accommodated) into the first surface 11a of the piezoelectric layer 11. A part of the first electrode layer 13 may be inserted (or accommodated) into the piezoelectric layer 11 through the plurality of grooves 11g. A part of the first electrode layer 13 may be inserted (or accommodated) into the first surface 11a of the piezoelectric layer 11 through the plurality of grooves 11g. Accordingly, the size (or area) of the first electrode layer 13 may be increased, and the contact area between the piezoelectric layer 11 and the first electrode layer 13 may be increased, and thus, an efficiency of supplying a signal applied to the piezoelectric layer 11 through the first electrode layer 13 may be increased.

The first cover member 30 may be disposed at a first surface of the vibration generating part 10. For example, the first cover member 30 may be configured to cover a lower part of the vibration generating part 10. For example, the first cover member 30 may be configured to cover the first electrode layer 13 of the vibration generating part 10. Accordingly, the first cover member 30 may protect the first surface of the vibration generating part 10.

The second cover member 50 may be disposed at a second surface of the vibration generating part 10. The second surface of the vibration generating part 10 may be different from or opposite to the first surface of the vibration generating part 10. For example, the second cover member 50 may be configured to cover the second electrode layer 15 of the vibration generating part 10. Accordingly, the second cover member 50 may protect the second electrode layer 15 provided at the second surface of the vibration generating part 10.

Each of the first cover member 30 and the second cover member 50 according to an example aspect of the present disclosure may include one or more materials of plastic, fiber, cloth, paper, leather, rubber, and wood, but aspects of the present disclosure are not limited thereto. For example, each of the first cover member 30 and the second cover member 50 may include the same material or different materials. For example, each of the first cover member 30 and the second cover member 50 may be a polyimide film, a polyethylene terephthalate film, or a polyethylene naphthalate, but aspects of the present disclosure are not limited thereto.

According to another example aspect of the present disclosure, one or more of the first cover member 30 and the second cover member 50 may include an adhesive member. For example, one or more of the first cover member 30 and the second cover member 50 may include an adhesive member coupled or adhered to the piezoelectric layer 11, and a protection member (or a delamination member) which covers or protects the adhesive member. For example, the adhesive member may include an electrical insulation material which has adhesive properties and is capable of compression and decompression. For example, the first cover member 30 may include an adhesive member coupled or adhered to the piezoelectric layer 11 and a protection member (or a delamination member) which covers or protects the adhesive member.

The first cover member 30 may be connected or coupled to at least a part of the first electrode layer 13 or the first surface of the vibration generating part 10 by the adhesive layer 40. For example, the first cover member 30 may be connected or coupled to at least a part of the first electrode layer 13 or the first surface of the vibration generating part 10 through a film laminating process by the adhesive layer 40.

The second cover member 50 may be connected or coupled to at least a part of the second electrode layer 15 or the second surface of the vibration generating part 10 by the adhesive layer 40. For example, the second cover member 50 may be connected or coupled to at least a part of the second electrode layer 15 or the second surface of the vibration generating part 10 through a film laminating process by the adhesive layer 40.

The adhesive layer 40 according to an example aspect of the present disclosure may include an electrical insulation material which has adhesive properties and is capable of compression and decompression. For example, the adhesive layer 40 may include epoxy resin, acrylic resin, silicone resin, and urethane resin, but aspects of the present disclosure are not limited thereto.

The signal cable 90 may be implemented to be connected to the vibration generating part 10 at one side or a part of the vibration generating part 10. The signal cable 90 may be connected to the vibration generating part 10, between the first cover member 30 and the second cover member 50.

An end part (or a distal end part) of the signal cable 90 may be disposed at or inserted (or accommodated) into a part between one periphery part EP of the first cover member 30 and one periphery part EP of the second cover member 50. The one periphery part EP of the first cover member 30 and the one periphery part EP of the second cover member 50 may accommodate or vertically cover a part of the signal cable 90. Accordingly, the signal cable 90 may be provided as one body with the vibration generating part 10, or the signal cable 90 may be integrated with the vibration generating part 10. For example, the vibration apparatus according to an example aspect of the present disclosure may be a vibration apparatus which is provided as one body with the signal cable 90, or a vibration apparatus may be integrated with the signal cable 90. For example, the signal cable 90 may be configured as a flexible cable, a flexible printed circuit cable, a flexible flat cable, a single-sided flexible printed circuit, a single-sided flexible printed circuit board (PCB), a flexible multilayer printed circuit, or a flexible multilayer PCB, but aspects of the present disclosure are not limited thereto.

The signal cable 90 according to an example aspect of the present disclosure may include a base member 91 and a plurality of signal lines 92a and 92b. For example, the plurality of signal lines 92a and 92b may include a first signal line 92a, and a second signal line 92b.

The base member 91 may include a transparent material or an opaque plastic material. For example, the base member 91 may include one or more of synthetic resins such as fluorine resin, polyimide-based resin, polyurethane-based resin, polyester-based resin, polyethylene-based resin, and polypropylene-based resin, but aspects of the present disclosure are not limited thereto. The base member 91 may be a base film or a base insulation film, but aspects of the present disclosure are not limited thereto.

The base member 91 may have a certain width in a first direction X and may extend lengthwise along the second direction Y intersecting with the first direction X.

Each of the first and second signal lines 92a and 92b may be disposed at or on a first surface of the base member 91 in parallel with the second direction Y, and may be spaced apart from or separated from each other along the first direction X. Each of the first and second signal lines 92a and 92b may be arranged in parallel at or on the first surface of the base member 91. For example, each of the first and second signal lines 92a and 92b may be implemented in a line shape by patterning of a metal layer (or a conductive layer) which is formed or deposited at or on the first surface of the base member 91.

End parts (or distal end parts) of each of the first and second signal lines 92a and 92b may be separated from each other, and thus, may be individually bent or curved. The end part of the first signal line 92a may be electrically connected to at least a part of the first electrode layer 13 of the vibration generating part 10 at the one periphery part EP of the first cover member 30. For example, the end part of the first signal line 92a may be electrically connected to at least a part of the first electrode layer 13 of the vibration generating part 10. For example, the end part of the first signal line 92a may be directly connected to or directly contact the first electrode layer 13 of the vibration generating part 10. Accordingly, the first signal line 92a may supply the driving signal, supplied from the vibration driving circuit, to the first electrode layer 13 of the vibration generating part 10. For example, the driving signal may be an alternating current (AC) signal.

The end part of the second signal line 92b may be electrically connected to at least a part of the second electrode layer 15 of the vibration generating part 10 at the one periphery part EP of the second cover member 50. For example, the end part of the second signal line 92b may be electrically connected to at least a part of the second electrode layer 15 of the vibration generating part 10. For example, the end part of the second signal line 92b may be directly connected to or directly contact the second electrode layer 15 of the vibration generating part 10. Accordingly, the second signal line 92b may supply the driving signal, supplied from the vibration driving circuit, to the second electrode layer 15 of the vibration generating part 10. For example, the driving signal may be supplied to the first signal line 92a and the second signal line 92b.

In the vibration generating part 10, the first electrode layer 13 may receive the driving signal through or by the first signal line 92a, and the second electrode layer 15 may receive the driving signal through or by the second signal line 92b. Accordingly, the vibration generating part 10 may alternately repeat contraction and/or expansion based on an inverse piezoelectric effect which is generated in the piezoelectric layer 11 based on the driving signal, and thus, may vibrate (or displace or drive).

The signal cable 90 according to an example aspect of the present disclosure may further include an insulation member 93.

The insulation member 93 may be disposed at the first surface of the base member 91 to cover each of the first and second signal lines 92a and 92b other than the end part of the signal cable 90. The insulation member 93 may be a protection layer, a coverlay, a coverlay layer, a cover film, an insulation film, or a solder mask, but aspects of the present disclosure are not limited thereto.

The signal cable 90 or the insulation member 93 may include a first extension part 91a which supports an end part of the first signal line 92a. The first extension part 91a may extend in the second direction Y from an end of the insulation member 93 covering the first signal line 92a disposed at the base member 91, and thus, may support the first signal line 92a. The first signal line 92a may be disposed at a lower surface (or a bottom surface) of the first extension part 91a so as to be directly connected to the vibration generating part 10.

The signal cable 90 or the base member 91 may include a second extension part 91b which individually supports an end part of the second signal line 92b. The second extension part 91b may extend in the second direction Y from an end of the base member 91, and thus, may support the second signal line 92b. The second signal line 92b may be disposed at a lower surface (or a bottom surface) of the second extension part 91b so as to be directly connected to the vibration generating part 10.

The signal cable 90 may include the first and second extension parts 91a and 91b which respectively support the end parts of each of the first and second signal lines 92a and 92b separated from each other. For example, the first and second extension parts 91a and 91b may be separated from each other between the one periphery part EP of the first cover member 30 and the one periphery part EP of the second cover member 50. Accordingly, the end parts (or distal end parts) of the first and second signal lines 92a and 92b may be separated from each other, and thus, may be individually bent or curved.

According to another example aspect of the present disclosure, each of the first and second extension parts 91a and 91b of the signal cable 90 may be omitted. For example, the first and second signal lines 92a and 92b may protrude or extend in a finger shape from the base member 91 of each of the first and second signal lines 92a and 92b, and may be electrically connected to or contact corresponding electrode layers 13 and 15 between the one periphery part of the first cover member 30 and the one periphery part of the second cover member 50, respectively. For example, the end parts of each of the first and second signal lines 92a and 92b may be electrically connected to or contact the corresponding electrode layers 13 and 15 by a conductive double-sided tape, and thus, an adhesive force to the corresponding electrode layers 13 and 15 may be secured.

The end part (or the distal end part) of the signal cable 90 inserted (or accommodated) between the first cover member 30 and the second cover member 50 may be inserted (or accommodated) and fixed between the first cover member 30 and the second cover member 50 through a film laminating process by a first adhesive layer 41 formed in the first cover member 30 and a second adhesive layer 42 formed in the second cover member 50. Therefore, the first signal line 92a may be maintained with being electrically connected to the first electrode layer 13 of the vibration generating part 10, and the second signal line 92b may be maintained with being electrically connected to the second electrode layer 15 of the vibration generating part 10. Furthermore, the end part (or the distal end part) of the signal cable 90 may be inserted (or accommodated) and fixed between the first cover member 30 and the second cover member 50, and thus, a connection defect between the vibration generating part 10 and the signal cable 90 caused by movement of the signal cable 90 may be prevented.

In the vibration apparatus according to an example aspect of the present disclosure, the first and second signal lines 92a and 92b of the signal cable 90 may be connected to the electrode layer of the vibration generating part 10 between the first cover member 30 and the second cover member 50, and thus, a soldering process for an electrical connection between the vibration generating part 10 and the signal cable 90 may not be needed, thereby simplifying a structure and a manufacturing process. Furthermore, according to an example aspect of the present disclosure, a manufacturing process may be simplified, and thus, process optimization may be realized by reducing production energy.

Figure 4:
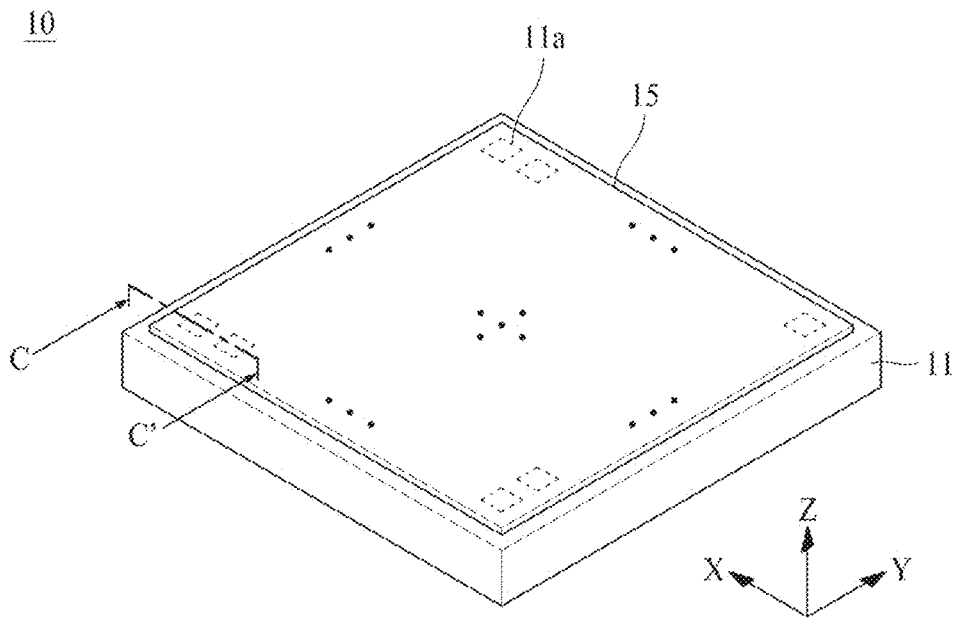
FIG. 4 is a perspective view taken the piezoelectric device illustrated in FIG. 1 according to an aspect of the present disclosure.
Figure 5:
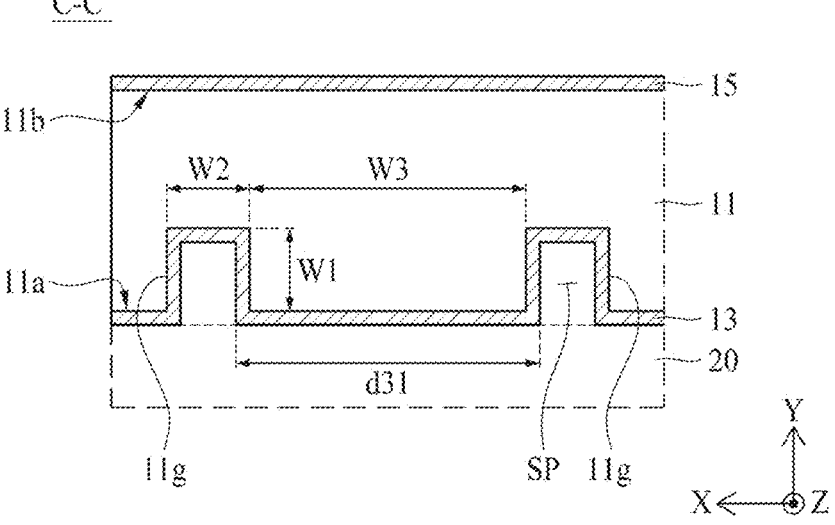
FIG. 5 is a cross-sectional view taken along line C-C' illustrated in FIG. 4 according to an aspect of the present disclosure.

FIG. 4 is a perspective view taken the piezoelectric device illustrated in FIG. 1 according to an aspect of the present disclosure. FIG. 5 is a cross-sectional view taken along line C-C' illustrated in FIG. 4 according to an aspect of the present disclosure.

Referring to FIGS. 4 and 5, the piezoelectric device (or vibration generating part) 10 may include a piezoelectric layer 11, a first electrode layer 13, and a second electrode layer 15.

The piezoelectric layer 11 may be provided between the first electrode layer 13 and the second electrode layer 15. For example, the piezoelectric layer 11 according to aspects of the present disclosure may comprise a composition represented by Equation 1.

$$0.96(Na_aK_{1-a})(Nb_b(Sb_{1-b}))O_3 \text{—} (0.04 - x)MZrO_3 \text{—} \quad \text{[Equation 1]}$$
$$x(Bi_cAg_{1-c})ZrO_3 + d \text{ mol } \% \text{ } E$$

where M is Sr, Ba, or Ca, E is $Fe_2O_3$, and
0.40≤a≤0.60, 0.90≤b≤0.98, 0.30≤c≤0.70, 0.00≤x≤0.04, and 0.00<d≤1.00.

For example, in accordance with aspects of the present disclosure, M may be Ca, a may be 0.5, b may be 0.93, c may be 0.5, d may be 0.5, and x may be 0.01.

The piezoelectric layer 11 according to aspects of the present disclosure may include a plurality of grooves 11g. For example, each of the plurality of grooves 11g may be configured on a first surface of the piezoelectric layer 11. For example, the plurality of grooves 11g may be configured to be concave in a direction from the first surface to the second surface of the piezoelectric layer 11. For example, each of the plurality of grooves 11g may have a dome shape, but aspects of the present disclosure are not limited thereto.

According to aspects of the present disclosure, each of the plurality of grooves 11g may be spaced apart by a predetermined distance and configured in parallel in a first direction X. For example, each of the plurality of grooves may be spaced apart by a predetermined distance and configured in parallel in a second direction Y perpendicular to the first direction X. For example, the piezoelectric layer 11 may have dimensions of 80 mm long, 80 mm wide, and 260 μm high, but aspects of the present disclosure are not limited thereto. For example, a first width W1 of each of the plurality of grooves 11g may range from 10% to 12% of a thickness of the piezoelectric layer 11, but aspects of the present disclosure are not limited thereto. For example, the first width W1 may be a height of each of the plurality of grooves 11g. For example, the first width W1 may be 30 μm or less, but aspects of the present disclosure are not limited thereto. For example, the second width (W2) of each of the plurality of grooves (11g) may be 10 μm to 30 μm or less, but aspects of the present disclosure are not limited thereto. For example, the second width W2 may be a transverse length or a longitudinal length of each of the plurality of grooves 11g. For example, the respective separation distance W3 between two adjacent grooves of the plurality of grooves 11g may be 300 μm or less, but aspects of the present disclosure are not limited thereto. For example, each of the plurality of grooves 11g may be spaced apart by 300 μm or less, but aspects of the present disclosure are not limited thereto. For example, based on the size and thickness of the piezoelectric layer 11, the size and shape of the plurality of grooves 11g may be configured to vary.

According to aspects of the present disclosure, each of the plurality of grooves 11g may be configured to have a predetermined spacing (for example, $d_{31}$). For example, in $d_{31}$, the first number 3 indicates a direction of electric field, and the last number 1 indicates a direction of mechanical strain. For example, in $d_{31}$, the first number may be a field direction, and the last number may be a left/right direction. Accordingly, the size, height, and/or shape of each of the plurality of grooves 11g may be adjusted to have $d_3$ required for the piezoelectric device 10. For example, each of the plurality of grooves 11g may be adjusted to vary in size, height, and/or shape based on the shape and material of the vibrating member to which the piezoelectric device 10 is applied.

According to aspects of the present disclosure, a plurality of grooves 11g may be configured in the piezoelectric layer 11 to have a grid-like (or a lattice-like) shape along each of the first direction X and second direction Y. The number of grooves 11g configured in the piezoelectric layer 11 may vary based on one or more of the size of the piezoelectric layer 11, the size of the grooves 11g, and the separation distance W3 between the grooves 11g. For example, the plurality of grooves 11g may be configured side-by-side in a first direction X and a second direction Y on one surface (or one side) of the piezoelectric layer 11 to have micro dome array shapes.

For example, the piezoelectric layer 11 according to aspects of the present disclosure may be fabricated using a digital light processing (DLP) 3D printer (DLP 3D printer) method, as described later with reference to FIGS. 6 to 8, but aspects of the present disclosure are not limited thereto.

According to aspects of the present disclosure, the first electrode layer 13 and the second electrode layer 15 may be disposed with the piezoelectric layer 11 interposed therebetween. The first electrode layer 13 may be disposed at a first surface (or a lower surface) of the piezoelectric layer 11. The second electrode layer 15 may be disposed at a second surface (or an upper surface) of the piezoelectric layer 11. According to aspects of the present disclosure, the first electrode layer 13 and the second electrode layer 15 are formed on each of the first (or lower) and second (or upper) surfaces of the piezoelectric layer 11, and thus, may be configured a piezoelectric device 10.

According to aspects of the present disclosure, the first electrode layer 13 and the second electrode layer 15 may have the same size as the piezoelectric layer 11 or may have a size smaller than the piezoelectric layer 11. For example, each of the first electrode layer 13 and the second electrode layer 15 may be formed at the other portion except a periphery (or an edge) part of the vibration layer 11. For example, a distance between a lateral surface (or a side surface) of the vibration layer 11 and a lateral surface (or a side surface) of each of the first electrode layer 13 and the second electrode layer 15 may be at least 0.5 mm or more, but aspects of the present disclosure are not limited thereto. For example, the distance between the lateral surface (or the side surface) of the vibration layer 11 and the lateral surface (or the side surface) of each of the first electrode layer 13 and the second electrode layer 15 may be at least 1 mm or more, but aspects of the present disclosure are not limited thereto.

The first electrode layer 13 may cover a plurality of grooves 11g configured at the first surface of the piezoelectric layer 11. For example, the first electrode layer 13 may be formed at the first surface of the piezoelectric layer 11 along a plurality of grooves 11g. For example, the first electrode layer 13 may be configured at the first surface of the piezoelectric layer 11 along the side surface and upper surface of each of the plurality of grooves 11g.

According to an aspect of the present disclosure, the piezoelectric layer 11 includes a plurality of grooves 11g, and the first electrode layer 13 is configured along the plurality of grooves 11g, and thus, a space SP may be configured between the piezoelectric device 10 and the vibration member 20 disposed on the first surface (or lower surface) of the piezoelectric device 10.

For example, in the piezoelectric device 10 including the piezoelectric layer 11 having a flat surface, the piezoelectric layer 11 is formed by a tape casting method, and thus, a lamination process is necessary to secure the thickness of the piezoelectric layer 11, and since it has a flat surface, the sound pressure characteristics depend on the characteristics of the material.

However, in accordance with aspects of the present disclosure, the piezoelectric layer 11 includes a plurality of grooves 11g and the first electrode layer 13 is configured along the plurality of grooves 11g, and thus, a space SP may be configured between the piezoelectric device 10 and the vibration member 20 such as a micro dome array. Accordingly, in accordance with aspects of the present disclosure, the space SP is generated between the piezoelectric device 10 and the vibration member 20, and thus, the displacement of the $d_{31}$ value of the vibrating member 20 may increase. Accordingly, in accordance with aspects of the present disclosure, the displacement of the $d_{31}$ value of the vibrating member 20 may increase, and thus, the sound pressure characteristics may be enhanced.

For example, $d_{33}$ and $d_{31}$ may be the electric field direction and the mechanical strain direction. For example, in $d_{33}$ and $d_{31}$, the first number may be the direction of the electric field and the last number may be the direction of mechanical strain. For example, in $d_{33}$ and $d_{31}$, the first number may be the direction of the electric field, 3-direction may be up/down, and 1-direction may be left/right. For example, since the first electrode layer 13 and the second electrode layer 15 are located up/down (or above/below) of the piezoelectric layer 11, when voltage is applied in 3-direction (up/down), mechanical displacement of the device may occur simultaneously in 3-direction and 1-direction. For example, when voltage is applied to the piezoelectric device 10 in 3-direction (up/down), the piezoelectric layer 11 may vibrate, decreasing in height and increasing in width, or it may vibrate, increasing in height and narrowing in width.

According to an aspect of the present disclosure, a dome-shaped groove 11g is configured at the piezoelectric layer 11, and thus, a space SP may be configured between the piezoelectric device 10 and the vibration member 20. Accordingly, the stress of the piezoelectric device 10 and the vibration member 20 is reduced, and thus, the displacement of the $d_{31}$ value of the vibration member 20 may increase, and the sound pressure characteristics may be enhanced.

According to an aspect of the present disclosure, the sound pressure characteristics of the piezoelectric device 10 may be improved compared to the same area.

According to an aspect of the present disclosure, the piezoelectric device 10 may be formed the piezoelectric layer 11 using a 3D printing process, and thus, the manufacturing process of the piezoelectric device may be simplified by eliminating the lamination process.

According to an aspect of the present disclosure, a piezoelectric device may be molded to fit the shape of the surface to which they are applied, and thus, the piezoelectric device may be easily applied to various apparatuses.

According to an aspect of the present disclosure, since the piezoelectric device 10 does not contain lead (Pb), production of regulated substances may be reduced and replacement of hazardous substances may be realized.

According to an aspect of the present disclosure, since the piezoelectric device 10 does not contain lead (Pb) and has high piezoelectric properties, the piezoelectric device 10 may be driven by low driving voltages to improve their piezoelectric properties and power consumption of the vibration apparatus may be reduced.

Figure 6:
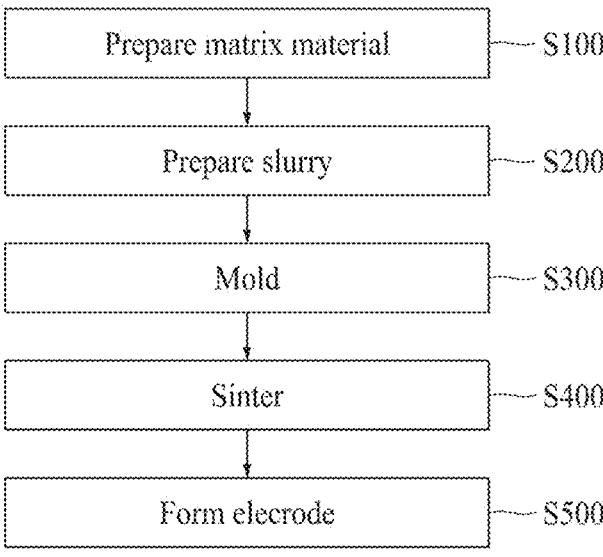
FIG. 6 illustrates a method of manufacturing piezoelectric device according to an aspect of the present disclosure.

FIG. 6 illustrates a method of manufacturing piezoelectric device according to an aspect of the present disclosure. FIG. 7 illustrates a method of manufacturing a matrix material of a piezoelectric device according to an aspect of the present disclosure. FIG. 8 illustrates a method of manufacturing a slurry of a piezoelectric device according to an aspect of the present disclosure. FIGS. 6 to 8 illustrate a method of manufacturing a piezoelectric device according to an aspect of the present disclosure of FIGS. 4 and 5.

Referring to FIG. 6, the method of manufacturing a piezoelectric device according to an aspect of the present disclosure may include a step S100 of preparing a matrix material, a step S200 of preparing a slurry using the matrix material, a step S300 of molding the slurry to prepare a molding element having a plurality of grooves, a step S400 of sintering the molding element to prepare a piezoelectric layer, and a step S500 of forming an electrode layer on the piezoelectric layer. For example, the matrix material of a piezoelectric device may be Equation 1 described with reference to FIG. 1.

Figure 7:
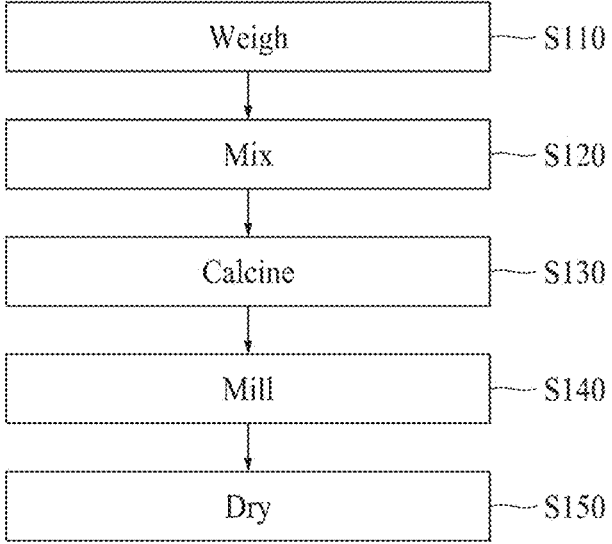
FIG. 7 illustrates a method of manufacturing a matrix material of a piezoelectric device according to an aspect of the present disclosure.

Referring to FIGS. 6 and 7, the step S100 of preparing a matrix material may include a step S110 of weighing raw materials, a step S120 of mixing the weighed raw materials, a step S130 of calcining and synthesizing the mixed raw materials, a step S140 of milling a synthesized matrix material, and a step S150 of drying the milled matrix material. In the following description, a condition based on the method of manufacturing the piezoelectric material composition may include, for example, a temperature, pressure, and a time, but aspects of the present disclosure are not limited thereto.

First, in a method for manufacturing the matrix material of the piezoelectric material composition according to an aspect of the present disclosure, the step S110 of weighing the raw material may be a step of weighing a raw material based on a mole ratio to add an appropriate amount of solvent. For example, the matrix material according to an aspect of the present disclosure may be Equation 1 described with reference to FIGS. 1 and 2. For example, the matrix material may be a KNN-based material. For example, the matrix material may be Na,K,Sr,Bi,Ag)(Nb,Sb,Zr)O$_3$, but aspects of the present disclosure are not limited thereto. The step S110 of weighing the raw material may be performed separately from the method of manufacturing or may be omitted.

For example, a raw material of a matrix material may include sodium carbonate (Na$_2$CO$_3$), potassium carbonate (K$_2$CO$_3$), niobium oxide (Nb$_2$O$_5$), antimony oxide (Sb$_2$O$_3$), strontium carbonate (SrCO$_3$), zirconium oxide (ZrO$_2$), calcium carbonate (CaCO$_3$), bismuth oxide (Bi$_2$O$_3$), and silver oxide (Ag$_2$O). However, aspects of the present disclosure are not limited thereto, and the raw material may include oxide other than carbonate including a corresponding positive ion (for example, Na$^+$, K$^+$, Nb$^{+5}$, Sb$^{+3}$, Ca$^{+2}$, Sr$^{+2}$, and Zr$^{+4}$). For example, the step S110 of weighing the raw material may be process which weighs the raw material on the basis of a mole ratio of a composition to synthesize, puts the weighed raw material into a nylon jar, and adds an appropriate amount of solvent (for example, ethanol).

Subsequently, the step S120 of mixing the raw materials may be a step of mixing and milling the weighed raw materials and the ethanol by a ball milling process. For example, a step of mixing and milling may be performed for 24 hours, but aspects of the present disclosure are not limited thereto.

An aspect of the present disclosure may further include a drying step to separate a power mixed with the solvent after the mixing step. For example, the drying step may be a process of separating mixed and milled raw materials for 24 hours from the ball, placing them in a dish, and drying them at a temperature about 100° C., but aspects of the present disclosure are not limited thereto. Accordingly, ethanol mixed with the raw material may be easily removed.

Subsequently, an aspect of the present disclosure may include the step S130 of calcining the raw materials. The step S130 of calcining the raw materials may be a step of phase-synthesizing primarily mixed raw materials. Accordingly, in an aspect of the present disclosure, carbonate of the raw material may be removed, and the raw material may uniformly react to form a uniform perovskite phase. For example, the phase-synthesizing step may include finely grinding the dried raw materials compound, placing it in an alumina crucible, calcining it in an electric furnace heated up to 850° C. and maintained for 6 hours, and then naturally cooling it to room temperature. For example, an increasing speed of the electric furnace may be 5° C./min, but aspects of the present disclosure are not limited thereto.

Subsequently, a step S140 of milling a synthesized matrix material may be a step in which the matrix material and solvent (ethanol) are mixed and milled using a ball mill process to make the particles smaller. For example, a step S140 of milling may be performed for 24 hours, but aspects of the present disclosure are not limited thereto.

Subsequently, in accordance with aspects of the present disclosure, the step of preparing a matrix material may further include a step S150 of drying to separate a powder mixed with the solvent after the milling step. For example, a step S150 of drying may put the milled matrix material into a dish and may sufficiently dry the milled matrix material at a temperature of 100° C., but aspects of the present specification are not limited thereto. For example, the matrix material may be dried for 3 hours, but aspects of the present disclosure are not limited thereto.

According to an aspect of the present disclosure, the step of preparing a matrix material may further include the step of sieving the milled and dried matrix material.

The sieving step may be filtering out dried powders finely grinded by the mortar by a 40-mesh sieve to produce powders including particles having a certain size or less. A powder passing through the 40-mesh sieve may have a size of 400 μm or less, but aspects of the present disclosure are not limited thereto.

Figure 8:
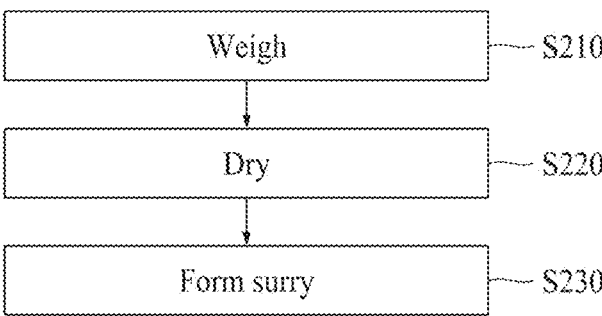
FIG. 8 illustrates a method of manufacturing a slurry of a piezoelectric device according to an aspect of the present disclosure.

Referring to FIGS. 6 to 8, the method of manufacturing a piezoelectric device according to an aspect of the present disclosure may include a step S200 of preparing a slurry using the matrix material after a step S100 of preparing a matrix material. The step S200 of preparing a slurry may include a step S210 of weighing, a step S220 of drying, and a step S230 of preparing the slurry.

First, a step S210 of weighing may be a step of adding and weighing an appropriate amount of dispersant and solvent to the matrix material having the composition of Equation 1 in FIGS. 4 and 5. For example, the solvent may include at least one of ethanol, methanol, butylene, isopropanol, methyl ethyl ketone (MEK), toluene, and distilled water, but aspects of the present disclosure are not limited thereto. For example, dispersant may be t-Octylphenoxypolyethoxyethanol, but aspects of the present disclosure are not limited thereto. For example, a solvent (or ethanol) may be added to the matrix material powder, and then mixed and milled for about 24 hours so that d50 is 0.9 μm to 1.0 μm, but aspects of the present specification are not limited thereto. For example, d50 may be the median of the particle size distribution. For example, d50 may be the particle size corresponding to 50% of the cumulative particle volume distribution curve. For example, d50 may be an indicator representing the median particle size in the area where the largest particle size is located in the particle size distribution.

After this, a ball is separated, t-Octylphenoxypolyethoxyethanol is added in an amount of 1.5 wt % compared to the matrix material, and ultrasonic dispersion can be performed for about 30 minutes, but aspects of the present specification are not limited thereto.

According to an aspect of the present disclosure, by adding an appropriate amount of dispersant and solvent to the matrix material, a mixture where the matrix material is well dispersed in the solvent may be prepared. For example, a dispersant may reduce the viscosity of the mixture.

Subsequently, the step S220 of drying may be a step of preparing a slurry from a dried mixture. For example, the step S220 of drying may be performed at a temperature of about 60° C. to 70° C., but aspects of the present specification are not limited thereto. For example, the step S220 of drying may be performed for 3 to 24 hours depending on the amount of mixture, but aspects of the present specification are not limited thereto.

Subsequently, the step S230 of preparing the slurry may be a step of preparing a slurry from a dried mixture. The slurry according to an aspect of the present disclosure may be a photo-curable slurry. For example, the step of preparing a slurry (S230) includes a dried mixture, acrylamide monomer, hexane-1,6-diol diacrylate, diphenyl(2,4,6-trimethylbenzoyl) phosphine oxide, and a small amount of defoamer, and then ball milling was performed for about 2 hours to prepare a photocurable piezoelectric slurry, but aspects of the present specification are not limited thereto. For example, the dried mixture may be added at 73% to 75%, but aspects of the present specification are not limited thereto. For example, acrylamide monomer may be added at 4% to 5%, but aspects of the present specification are not limited thereto. For example, hexane-1,6-diol diacrylate may be added at 19% to 21%, but aspects of the present specification are not limited thereto. For example, diphenyl(2,4,6-trimethylbenzoyl) phosphine oxide may be added in less than 1%, but aspects of the present specification are not limited thereto. For example, a small amount of defoamer may be added to prevent the formation of air bubbles and bubbles during the mixing process.

An aspect of the present disclosure may further include an aging step and a degassing step of removing air bubbles and gases.

The degassing step may be a step of adjusting the slurry to have appropriate viscosity for a molding process, in a below-described step of molding a piezoelectric material. For example, the degassing step may be adjusted to have a viscosity of 1,000 cPs to 3,000 cPs (centipoisc) by using a vacuum stirrer at a room temperature, but aspects of the present specification are not limited thereto. The aging step may be a step of adjusting a temperature to a room temperature again because the slurry is cooled when a solvent is volatilized in the degassing step. Accordingly, a piezoelectric material having a slurry form may be configured.

Subsequently, a step S300 of molding the slurry to prepare a molding element may be a step of manufacturing the molding element having a certain volume and shape by using the slurry (or a piezoelectric material) where the matrix material prepared in the step S200 are mixed with each other.

For example, in a step S300 of molding the slurry (or the piezoelectric material) to prepare a molding element, the molding element may be fabricated using a digital light processing (DLP) 3D printer (DLP 3D printer) method. For example, a digital light processing (DLP) 3D printer (DLP 3D printer) method may be a method of printing using liquid materials (or semi-solid materials) rather than solid materials.

For example, a step S300 of molding the slurry to prepare a molding element may be performed as follows. First, slurry may be loaded into the DPL 3D printer. Next, after adjusting the curing layer to 20 μm, 13 layers may be stacked and printed to have a total thickness of 260 μm, width 80 mm, and length 80 mm.

For example, the plurality of grooves may be formed in the first 2 layers stacked. However, it is not necessarily limited to this, and a plurality of grooves may be formed in the last 2 layers stacked. For example, the horizontal and vertical lengths of each of the plurality of grooves may be 10 μm and 30 μm, each of the first direction (X or horizontal direction) and the vertical direction (Y or vertical direction) may have 250 grooves, and a total of 62,500 grooves may be configured. For example, the thickness of the first 2 layers may be 40 μm, and the thickness of the groove may be 30 μm or less. After this, the remaining 11 stacked layers may have a flat surface. Accordingly, a piezoelectric material molding element may have grooves or micro dome arrays.

Subsequently, the step S400 of sintering the molding element to prepare a sintered body may be performed in one temperature period, and then, may be cooled. For example, the step S400 of sintering the molding element to prepare a sintered body may be performed within 1,090° C. for 6 hours, but aspects of the present specification are not limited thereto. Accordingly, the sintering density of the sintered body may be improved. For example, the sintered body may be a piezoelectric material sintered body. For example, the sintered body may be the piezoelectric layer of FIGS. 4 and 5.

Subsequently, the step S500 of forming an electrode layer on the sintered body may be a step of forming electrodes on a first surface and a second surface opposite the first surface (or different from the first surface) of the piezoelectric material sintered body, prepared in the previous step. For example, a first electrode layer may be configured on the first surface of the piezoelectric material sintered body. For example, the first electrode layer may be formed along grooves formed in the sintered piezoelectric material (or piezoelectric layer). For example, the first electrode layer may be formed to cover a groove formed in the piezoelectric material sintered body (or piezoelectric layer). For example, a second electrode layer may be formed on a second surface different from the first surface of the piezoelectric material sintered body (or piezoelectric layer).

According to an aspect of the present disclosure, the piezoelectric material sintered body of the piezoelectric device may be manufactured by a 3D printing process, and thus, the manufacturing process of the piezoelectric device may be simplified by eliminating the lamination process.

According to an aspect of the present disclosure, a piezoelectric device may be molded to fit the shape of the surface to which they are applied, and thus, the piezoelectric device may be easily applied to various apparatuses.

According to an aspect of the present disclosure, the piezoelectric device does not contain lead (Pb), and thus, production of regulated substances may be reduced and replacement of hazardous substances can be realized.

According to an aspect of the present disclosure, the piezoelectric device may include grooves, and may have strong piezoelectric characteristics, and thus, may be driven by low driving voltages to improve piezoelectric properties of the piezoelectric device and power consumption of the vibration apparatus may be reduced.

Figure 9:
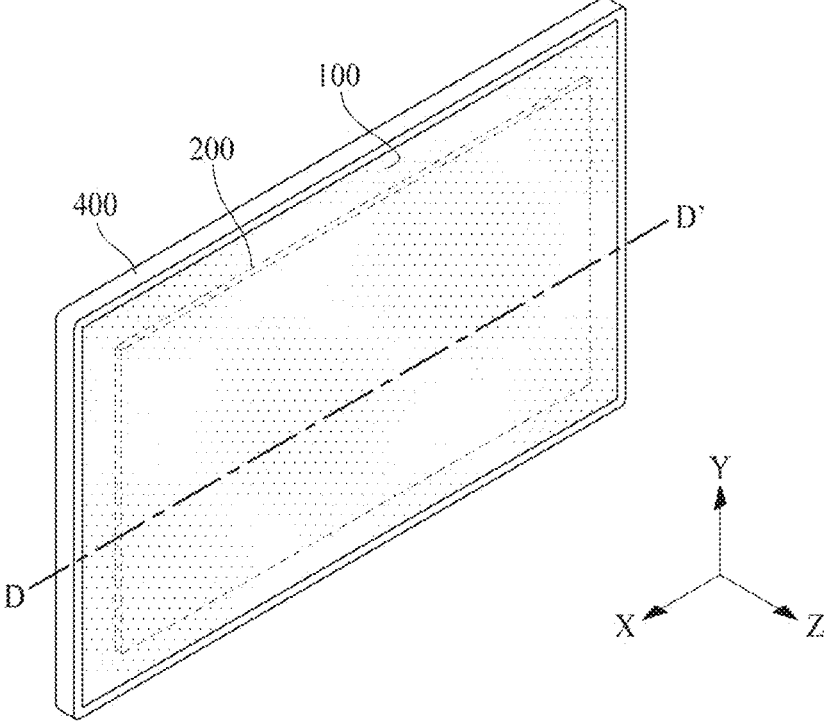
FIG. 9 is a perspective view of an apparatus according to an aspect of the present disclosure.
Figure 10:
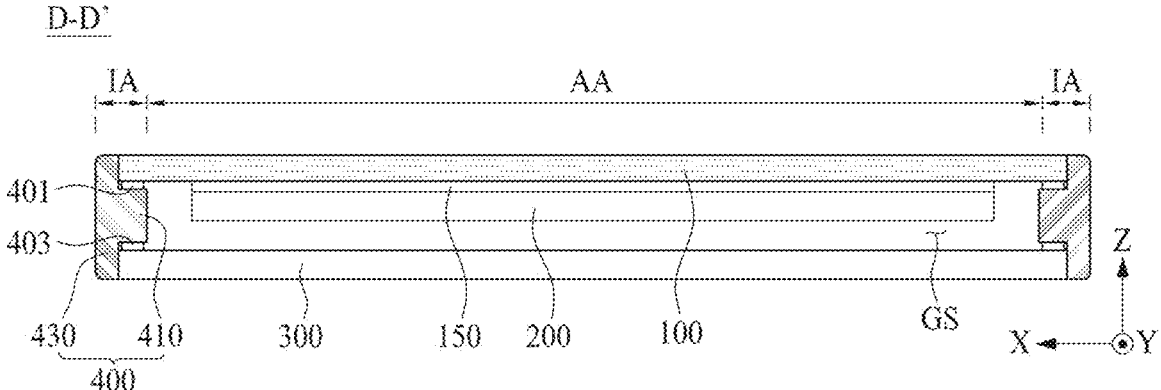
FIG. 10 is a cross-sectional view taken along line D-D' of FIG. 9 according to an aspect of the present disclosure.

FIG. 9 is a perspective view of an apparatus according to an aspect of the present disclosure. FIG. 10 is a cross-sectional view taken along line D-D' of FIG. 9 according to an aspect of the present disclosure.

Referring to FIGS. 9 and 10, an apparatus according to an aspect of the present disclosure may implement or realize a sound apparatus, a sound output apparatus, a vibration apparatus, a vibration generating apparatus, a sound bar, a sound system, a sound apparatus for electronic devices, a sound apparatus for display, a sound apparatus for vehicular apparatuses, or a sound bar for vehicular apparatuses. For example, the vehicular apparatus may include one or more seats and one or more glass windows. For example, the vehicular apparatus may include a vehicle, a train, a ship, or an aircraft, but aspects of the present disclosure are not limited thereto. Further, an apparatus according to an aspect of the present disclosure may implement an analog signage or a digital signage such as an advertising signboard, a poster, or a guideboard.

The apparatus according to an aspect of the present disclosure may be an apparatus including a plurality of pixels, but aspects of the present disclosure are not limited thereto.

The display apparatus may include a display panel, including a plurality of pixels implementing a black and white, or color image, and a driver for driving the display panel. Each of the plurality of pixels may be a subpixel configuring one of a plurality of colors implementing a color image. An apparatus according to an aspect of the present disclosure may include a notebook computer, a television (TV), a computer monitor, an equipment apparatus including a specific form of a vehicle or a vehicular or automotive apparatus, and a set device (or a set apparatus) or a set electronic apparatus such as a smartphone or an electronic pad, which are complete products (or final products) including a display panel such as a liquid crystal display panel or an organic light emitting display panel.

Referring to FIG. 9, an apparatus according to an aspect of the present disclosure may include a vibration member 100 and a vibration apparatus 200.

The vibration member 100 may generate a vibration, based on a displacement (or driving or vibration) of the vibration apparatus 200, or may output a sound (or a sound wave). The vibration member 100 may be a vibration object, a display member, a display panel, a signage panel, a passive vibration plate, a front member, a rear member, a vibration panel, a sound panel, a passive vibration panel, a sound output plate, a sound vibration plate, or an image screen, but aspects of the present disclosure are not limited thereto.

For example, the vibration member 100 may include one or more of a display panel including a pixel configured to display an image, a screen panel on which an image is to be projected from a display apparatus, a lighting panel, a signage panel, a vehicular interior material, a vehicular glass window, a vehicular exterior material, a ceiling material of a building, an interior material of a building, a glass window of a building, an interior material of an aircraft, and a glass window of an aircraft. For example, the vibration member 100 may include one or more of wood, plastic, glass, metal, cloth, fiber, paper, rubber, leather, carbon, and mirror.

Hereinafter, an example where the vibration member 100 is a display panel will be described.

Referring to FIGS. 9 and 10, the display panel 100 may display an image, and for example, may display an image (for example, an electronic image, a digital image, a still image, or a video image). For example, the display panel 100 may emit light to display an image. The display panel 100 may be a curved display panel or all types of display panels such as a liquid crystal display panel, an organic light emitting display panel, a quantum dot light emitting display panel, a micro light emitting diode display panel, and an electrophoresis display panel. The display panel 100 may be a flexible display panel. For example, the display panel 100 may be a flexible light emitting display panel, a flexible electrophoresis display panel, a flexible electro-wetting display panel, a flexible micro light emitting diode display panel, or a flexible quantum dot light emitting display panel, but aspects of the present disclosure are not limited thereto.

The display panel 100 according to an aspect of the present disclosure may include a display area AA which displays an image on the basis of driving of a plurality of pixels. Also, the display panel 100 may include a non-display area IA which surrounds the display area AA, but aspects of the present disclosure are not limited thereto. For example, the non-display area IA may be at a periphery of the display area AA.

The vibration apparatus 200 may be configured to vibrate the display panel 100. For example, the vibration apparatus 200 may vibrate the display panel 100 at the rear surface of the display panel 100, and thus, may provide a user with a sound and/or a haptic feedback on the basis of a vibration of the display panel 100. The vibration apparatus 200 may be implemented at the rear surface of the display panel 100 to directly vibrate the display panel 100.

According to an aspect of the present disclosure, the vibration apparatus 200 may vibrate based on a vibration driving signal synchronized with an image displayed by the display panel 100, thereby vibrating the display panel 100. According to another aspect of the present disclosure, the vibration apparatus 200 may vibrate based on a haptic feedback signal (or a tactile feedback signal) synchronized with a user touch applied to a touch panel (or a touch sensor layer) which is disposed on the display panel 100 or embedded in the display panel 100, and thus, may vibrate the display panel 100. Accordingly, the display panel 100 may vibrate based on a vibration of the vibration apparatus 200 to provide a user (or a viewer) with one or more of a sound and a haptic feedback.

The vibration apparatus 200 according to an aspect of the present disclosure may be implemented to have a size corresponding to the display area AA of the display panel 100. A size of the vibration apparatus 200 may be 0.9 to 1.1 times a size of the display area AA of the display panel 100, but aspects of the present disclosure are not limited thereto. For example, a size of the vibration apparatus 200 may be less than or equal to that of the display area AA. For example, a size of the vibration apparatus 200 may be equal to or almost equal to that of the display area AA of the display panel 100, and thus, may cover a large region of the display panel or the display panel 100 and a vibration generated by the vibration apparatus 200 may vibrate an entire region of the display panel 100, thereby enhancing satisfaction of a user (or a viewer) and increasing a sense of orientation of a sound (or a sound image specify or a sound image fixing). Also, a contact area (or a panel coverage) between the display panel 100 and the vibration apparatus 200 may increase, and thus, a vibration region of the display panel 100 may increase, thereby enhancing a sound of a middle-low pitched sound band generated based on a vibration of the display panel 100. Also, the vibration apparatus 200 applied to a large-sized apparatus may vibrate all of the display panel 100 having a large size (or a large area), and thus, a sense of orientation of a sound (or a sound image specify or a sound image fixing) based on a vibration of the display panel 100 may be further enhanced, thereby realizing an enhanced sound effect. Accordingly, the vibration apparatus 200 according to an aspect of the present disclosure may be disposed at the rear surface of the display panel 100 to sufficiently vibrate the display panel 100 in a vertical (or forward and rearward) direction, thereby outputting a desired sound in a forward direction of the apparatus or the display apparatus.

The vibration apparatus 200 according to an aspect of the present disclosure may be implemented as a film type. Because the vibration apparatus 200 is implemented as a film type, the vibration apparatus 200 may have a thickness which is thinner than the display panel 100, thereby minimizing an increase in thickness of the apparatus caused by the arrangement of the vibration apparatus 200. For example, the vibration apparatus 200 may be referred to as a sound generating module, a vibration generating apparatus, a film actuator, a film type piezoelectric composite actuator, a film speaker, a film type piezoelectric speaker, or a film type piezoelectric composite speaker, which uses the display panel 100 as a sound vibration plate, but aspects of the present disclosure are not limited thereto.

In another aspect of the present disclosure, the vibration apparatus 200 may not be disposed at the rear surface of the display panel 100 and may be applied to a vibration object instead of the display panel 100. For example, the vibration object may be a non-display panel, a mirror, an interior material of a vehicle, a glass window of a vehicle (or a vehicle window), an indoor ceiling of a building, a glass window of a building, an interior material of an aircraft, or a glass window of an aircraft, but aspects of the present disclosure are not limited thereto. For example, the vibration object may be a sound panel or a sound plate including one or more of wood, metal, plastic, glass, cloth, paper, fiber, rubber, leather, and carbon, but aspects of the present disclosure are not limited thereto. For example, the non-display panel may be a light emitting diode lighting panel (or apparatus), an organic light emitting lighting panel (or apparatus), or an inorganic light emitting lighting panel (or apparatus), but aspects of the present disclosure are not limited thereto. In this case, a vibration object may be applied as a vibration plate, and the vibration apparatus 200 may vibrate the vibration object to output a sound.

Referring to FIG. 10, an apparatus according to an aspect of the present disclosure may include a connection member 150 between a vibration apparatus 200 and a display panel 100.

The connection member 150 may include at least one base member and may include an adhesive layer attached on one surface or both surfaces of the base member, or may be configured as a single-layered adhesive layer.

According to an aspect of the present disclosure, the connection member 150 may include a foam pad, a double-sided tape, a double-sided foam tape, or an adhesive, but aspects of the present disclosure are not limited thereto. For example, the adhesive layer of the connection member 150 may include epoxy, acryl, silicone, or urethane, but aspects of the present disclosure are not limited thereto.

The apparatus according to an aspect of the present disclosure may further include a supporting member 300 which is disposed at a rear surface of the display panel 100.

The supporting member 300 may cover the rear surface of the display panel 100. For example, the supporting member 300 may include one or more of a glass material, a metal material, and a plastic material. For example, the supporting member 300 may be a rear structure material or a set structure material. For example, the supporting member 300 may be referred to as the other term such as a cover bottom, a plate bottom, a back cover, a base frame, a metal frame, a metal chassis, a chassis base, or an m-chassis. Therefore, the supporting member 300 may be implemented as an arbitrary type frame or a plate structure material disposed on the rear surface of the display panel 100.

The apparatus according to an aspect of the present disclosure may further include a middle frame 400.

The middle frame 400 may be disposed between a rear edge (or a rear periphery) of the display panel 100 and a front edge portion (or a front periphery portion) of the supporting member 300. The middle frame 400 may support each of one or more of an edge portion (or a periphery portion) of the display panel 100 and an edge portion (or a periphery portion) of the supporting member 300 and may surround one or more of lateral surfaces of each of the display panel 100 and the supporting member 300. The middle frame 400 may provide a gap space GS between the display panel 100 and the supporting member 300. The middle frame 400 may be referred to as a middle cabinet, a middle cover, or a middle chassis, but aspects of the present disclosure are not limited thereto.

The middle frame 400 according to an aspect of the present disclosure may include a first supporting part 410 and a second supporting part 430.

The first supporting part 410 may be disposed between the rear edge (or the rear periphery) of the display panel 100 and the front edge (or the front periphery) of the supporting member 300, and thus, may provide the gap space GS between the display panel 100 and the supporting member 300. A front surface of the first supporting part 410 may be coupled to or connected with the rear edge portion (or the rear periphery portion) of the display panel 100 by a first frame connection member 401. A rear surface of the first supporting part 410 may be coupled to or connected with a front edge portion (or a front periphery portion) of the supporting member 300 by a second frame connection member 403. For example, the first supporting part 410 may have a single picture frame structure having a tetragonal shape, or may include a picture frame structure having a plurality of division bar shapes.

The second supporting part 430 may be vertically coupled to an outer surface of the first supporting part 410 in parallel with a thickness direction Z of an apparatus. The second supporting part 430 may surround one or more of an outer surface of the display panel 100 and an outer surface of the supporting member 300, and thus, may protect the outer surface of each of the display panel 100 and the supporting member 300. The first supporting portion 410 may protrude toward the gap space GS between the display panel 100 and the supporting member 300 from an inner surface of the second supporting part 430.

Figure 11:
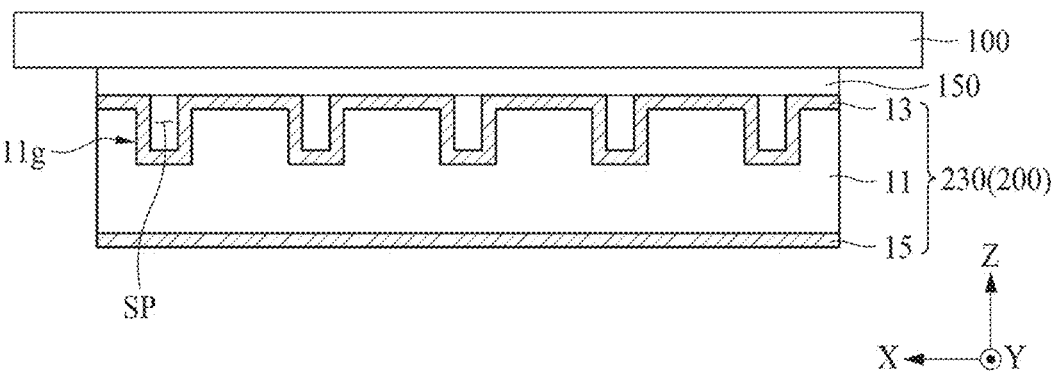
FIG. 11 illustrates a vibration device of FIG. 9 according to an aspect of the present disclosure.

FIG. 11 illustrates a vibration device of FIG. 9 according to an aspect of the present disclosure.

Referring to FIG. 11, a vibration apparatus 200 according to an aspect of the present disclosure may include a piezo-electric device 230. The piezoelectric device 230 may be the same or substantially the same as the piezoelectric device 10 described above with reference to FIGS. 1 to 8, and thus, repeated descriptions thereof are omitted or will be briefly given.

The piezoelectric device 230 may include a piezoelectric layer 11, a first electrode layer 12 disposed at a first surface of the piezoelectric layer 11, and a second electrode layer 13 disposed at a second surface, which is opposite to (or different from) the first surface, of the piezoelectric layer 11.

According to an aspect of the present disclosure, the piezoelectric layer 11 may include the matrix material described with reference to FIGS. 1 to 8 and may include a plurality of grooves 11g formed on the first surface. For example, the first surface of the piezoelectric device 230 formed with a plurality of grooves 11g may be arranged to face the vibration member 100. For example, the first surface of the piezoelectric layer 11 formed with a plurality of grooves 11g may be arranged to face the vibration member 100. For example, the first surface of the piezo-electric layer 11 formed with a plurality of grooves 11g may be connected to the vibrating member 100 by the connecting member 150.

The first electrode layer 13 may be formed on the first surface of the piezoelectric layer 11 along a plurality of grooves 11g. For example, the first electrode layer 13 may be formed on the first surface of the piezoelectric layer 11 along the side and upper surfaces of each of the plurality of grooves 11g.

According to the aspect of the present disclosure, the piezoelectric layer 11 includes a plurality of grooves 11g, and the first electrode layer 13 is configured along the plurality of grooves 11g, and thus, a space SP may be configured between the piezoelectric device 230 and the vibration member 100 placed on a first surface of the piezoelectric device 230.

According to the aspect of the present disclosure, the space SP is generated between the piezoelectric device 230 and the vibration member 100, and thus, the stress of the vibration member 100 may be decreased and the vibration displacement of the $d_{31}$ value of vibration member 100 may be increased. According to the aspect of the present disclosure, the vibration displacement of the $d_{31}$ value of vibration member 100 may be increased, and thus, the sound pressure characteristics may be improved. Accordingly, the piezoelectric device 230 according to the aspect of the present disclosure may be improved the sound pressure characteristics compared to the same arca.

Figure 12:
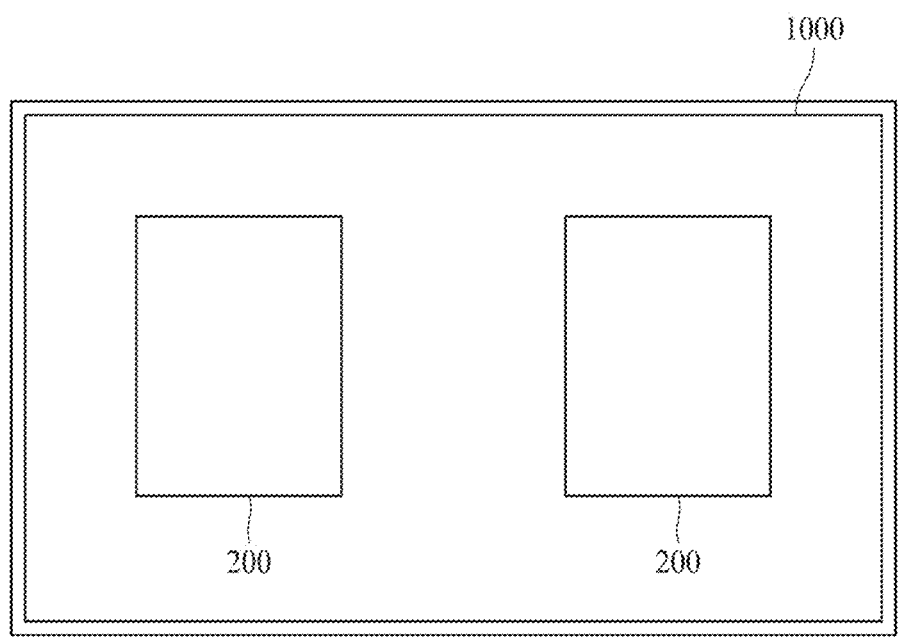
FIG. 12 is a plan view of an apparatus comprising a piezoelectric device according to an aspect of the present disclosure.

FIG. 12 is a plan view of an apparatus comprising a piezoelectric device according to an aspect of the present disclosure.

Referring to FIG. 12, the vibration apparatus 200 may be the piezoelectric device described with reference to FIGS. 1 to 8. Hereinafter, the vibration apparatus 200 will be described as being a piezoelectric device. According to the aspect of the present disclosure, the apparatus 1000 may be connected to at least one piezoelectric device 200. Accordingly, the apparatus 1000 may be connected to at least one piezoelectric device 200, and thus, the apparatus 1000 may produce sound and/or vibration (or haptic vibration) by the vibration of the piezoelectric device 200.

According to the aspect of the present disclosure, the piezoelectric device 200 may provide a visual function, an auditory function, and a multi (or visual and auditory) function by control of the driving frequency.

Figure 13:
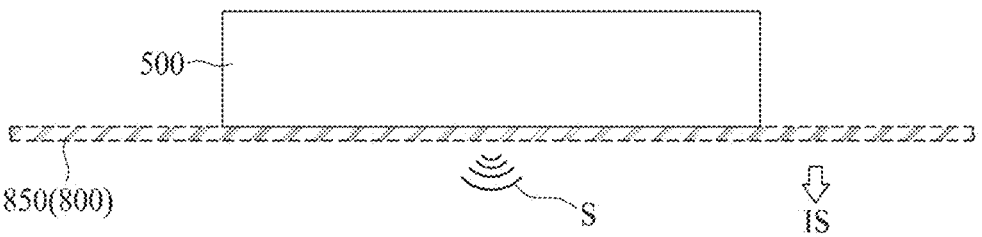
FIG. 13 illustrates a sound apparatus for a vehicle according to an aspect of the present disclosure.

FIG. 13 illustrates a sound apparatus for a vehicle according to an aspect of the present disclosure.

Referring to FIG. 13, a sound apparatus for a vehicle according to an aspect of the present disclosure may include a sound apparatus 500. The sound apparatus 500 may be disposed or equipped in or at a vehicle to output a sound S toward an internal space IS of a vehicle 800.

The vehicle 800 may include an interior material (or an interior finish material) 850. In the following description, for convenience of description, the "interior material 850" may be referred to as a "vehicular interior material 850."

The vehicular interior material 850 may include all parts configuring the inside of the vehicle 800, or may include all parts disposed at the internal space IS of the vehicle 800. For example, the vehicular interior material 850 may be an interior member or an inner finishing member of the vehicle 800, but aspects of the present disclosure are not limited thereto.

The vehicular interior material 850 according to an aspect of the present disclosure may be configured to be exposed at the internal or interior space IS of the vehicle 800, in the internal or interior space IS of the vehicle 800. For example, the vehicular interior material 850 may be provided to cover one surface (or an interior surface) of at least one of a main frame (or a vehicular body), a side frame (or a side body), a door frame (or a door body), a handle frame (or a steering hub), and a seat frame, which are exposed at the interior space IS of the vehicle 800.

The vehicular interior material 850 according to an aspect of the present disclosure may include a dash board, a pillar interior material (or a pillar trim), a floor interior material (or a floor carpet), a roof interior material (or a headliner), a door interior material (or a door trim), a handle interior material (or a steering cover), a seat interior material, a rear package interior material (or a backseat shelf), an overhead console (or an indoor illumination interior material), a rear view mirror, a glove box, and a sun visor, but aspects of the present disclosure are not limited thereto.

The vehicular interior material 850 according to an aspect of the present disclosure may include one or more of metal, wood, rubber, plastic, glass, fiber, cloth, paper, mirror, leather, and carbon, but aspects of the present disclosure are not limited thereto. The vehicular interior material 850 including a plastic material may be an injection material which is implemented by an injection process by thermosetting resin or thermoplastic resin, but aspects of the present disclosure are not limited thereto. The vehicular interior material 850 including a fiber material may include one or more of synthetic fiber, carbon fiber (or aramid fiber), and natural fiber, but aspects of the present disclosure are not limited thereto. The vehicular interior material 850 including a fiber material may include may be a fabric sheet, a knitting sheet, or a nonwoven fabric, but aspects of the present disclosure are not limited thereto. For example, the interior material 20c or the outer surface member including a fiber material may be a fabric member, but aspects of the present disclosure are not limited thereto. For example, the paper may be cone paper. For example, the cone paper may be pulp or foam plastic, but aspects of the present disclosure are not limited thereto. The vehicular interior material 850 including a leather material may include may be a natural leather or an artificial leather, but aspects of the present disclosure are not limited thereto.

The vehicular interior material 850 according to an aspect of the present disclosure may include one or more of a flat portion and a curved portion. For example, the vehicular interior material 850 may have a structure corresponding to a structure of a corresponding vehicular structure material, or may have a structure which differs from the structure of the corresponding vehicular structure material.

According to an aspect of the present disclosure, the sound apparatus 500 may be disposed at the vehicular interior material 850. The sound apparatus 500 may vibrate the vehicular interior material 850 to generate a sound S, based on a vibration of the vehicular interior material 850. For example, the sound apparatus 500 may directly vibrate the vehicular interior material 850 to generate the sound S, based on a vibration of the vehicular interior material 850.

For example, the sound apparatus 500 may be configured with one of the piezoelectric devices according to one or more aspects of the present disclosure described above with reference to FIGS. 1 to 8.

For example, the sound apparatus 500 may be configured to vibrate the vehicular interior material 850 to output the sound S toward the internal or interior space IS of the vehicle 800. Therefore, the vehicular interior material 850 may be used as a sound vibration plate. The vehicular interior material 850 may be a vibration plate, a sound vibration plate, or a sound generating plate for outputting the sound S. For example, the vehicular interior material 850 may have a size which is greater than that of the sound apparatus 500, but aspects of the present disclosure are not limited thereto.

For example, the sound apparatus 500 may be disposed at one or more of a dash board, a pillar interior material, a floor interior material, a roof interior material, a door interior material, a handle interior material, and a seat interior material, or may be disposed in one or more of a rear package interior material, an overhead console, a rear view mirror, a glove box, and a sun visor.

The sound apparatus 500 according to an aspect of the present disclosure may vibrate a correspond vehicular interior material 850 through at least one of one or more sound apparatuses 500 disposed at the vehicular interior material 850 to output a realistic sound S and/or stereo sound, including a multichannel, toward the interior space IS of the vehicle 800.

A piezoelectric device, a method of manufacturing the same, and an apparatus including the piezoelectric device according to one or more example aspects of the present disclosure are described below.

A piezoelectric device according to aspects of the present disclosure may comprise a first electrode layer, a second electrode layer, and a piezoelectric layer between the first electrode layer and the second electrode layer. The piezoelectric layer may comprise a plurality of grooves.

According to one or more aspects of the present disclosure, each of the plurality of grooves may be concave from a first surface of the piezoelectric layer.

According to one or more aspects of the present disclosure, a part of the first electrode layer may be accommodated on a first surface of the piezoelectric layer by the plurality of grooves.

According to one or more aspects of the present disclosure, each of the plurality of grooves may comprise a polygonal-shaped cross-sectional structure, a curved cross-sectional structure, or a dome-shaped cross-sectional structure.

According to one or more aspects of the present disclosure, the piezoelectric layer may comprise a first surface facing the first electrode layer and a second surface facing the second electrode layer. The plurality of grooves may be between the first surface of the piezoelectric layer and the first electrode layer.

According to one or more aspects of the present disclosure, a width and a height of each of the plurality of grooves may be in the range of 10 μm to 30 μm.

According to one or more aspects of the present disclosure, a height of each of the plurality of grooves may range from 10% to 12% of a thickness of the piezoelectric layer.

According to one or more aspects of the present disclosure, the first electrode layer may cover each of the plurality of grooves.

According to one or more aspects of the present disclosure, the first electrode layer may have a cross-sectional shape corresponding to a cross-sectional shape of a first surface of the piezoelectric layer including the plurality of grooves.

A method of manufacturing a piezoelectric device according to one or more example aspects of the present disclosure may comprise preparing a matrix material, preparing a slurry using the matrix material, molding the slurry to prepare a molding element having a plurality of grooves, sintering the molding element to prepare a piezoelectric layer, and forming an electrode layer on the piezoelectric layer.

According to one or more aspects of the present disclosure, the matrix material is represented by Equation 1, $$0.96(Na_aK_{1-a})(Nb_b(Sb_{1-b}))O_3—(0.04 - x)MZrO_3—$$
$$x(Bi_cAg_{1-c})ZrO_3 + d \text{ mol } \% E \qquad \text{Equation 1}$$

where M is Sr, Ba, or Ca, E is $Fe_2O_3$, and $0.40{\le}a{\le}0.60$, $0.90{\le}b{\le}0.98$, $0.30{\le}c{\le}0.70$, $0.00{\le}x{\le}0.04$, and $0.00{<}d{\le}1.00$.

According to one or more aspects of the present disclosure, the preparing the slurry using the matrix material may comprise weighing the matrix material, a dispersant, and a solvent, mixing a weighed material, drying the mixed material, and grinding the dried mixed material to prepare the slurry.

According to one or more aspects of the present disclosure, the molding the slurry to prepare the molding element may include forming the molding element, at least in part, by a 3D printing method.

According to one or more aspects of the present disclosure, the molding the slurry to prepare the molding element may comprise forming first to n-th slurry layers by the 3D printing method, wherein n is a natural number greater than or equal to 5, and forming the plurality of grooves in first and second slurry layers of the first to n-th slurry layers.

According to one or more aspects of the present disclosure, the plurality of grooves may be spaced apart from each other and may extend in a first direction and in a second direction perpendicular to the first direction.

According to one or more aspects of the present disclosure, the electrode layer may comprise a first electrode layer on a first surface of the piezoelectric layer, and a second electrode layer on a second surface of the piezoelectric layer. The plurality of grooves may be between the first surface of the piezoelectric layer and the first electrode layer.

According to one or more aspects of the present disclosure, a part of the first electrode layer may be accommodated on the first surface of the piezoelectric layer by the plurality of grooves.

According to one or more aspects of the present disclosure, the first electrode layer may have a cross-sectional shape corresponding to a cross-sectional shape of the first surface of the piezoelectric layer including the plurality of grooves.

An apparatus according to one or more example aspects of the present disclosure may comprise a vibration member, and a vibration device configured to vibrate the vibration member. The vibration device may be a piezoelectric device, comprising a piezoelectric layer having a plurality of grooves, a first electrode layer on a first surface of the piezoelectric layer, and a second electrode layer on a second surface of the piezoelectric layer.

According to one or more aspects of the present disclosure, the plurality of grooves of the piezoelectric device may face the vibration member.

According to one or more aspects of the present disclosure, the first electrode layer may be disposed on the plurality of grooves in the piezoelectric layer. The apparatus may further comprise a connection member between the first electrode layer and the vibration member.

According to one or more aspects of the present disclosure, the apparatus may further comprise a plurality of spaces between the plurality of grooves and the vibration member.

According to one or more aspects of the present disclosure, the vibration member may comprise one or more of a display panel including a plurality of pixels configured to display an image, a screen panel on which an image is to be projected from a display apparatus, a light emitting diode lighting panel, an organic light emitting lighting panel, an inorganic light emitting lighting panel, a signage panel, an interior material of a vehicle, an exterior material of a vehicular means, a glass window of a vehicle, a seat interior material of a vehicle, a ceiling material of a building, an interior material of a building, a glass window of a building, an interior material of an aircraft, a glass window of an aircraft, wood, plastic, glass, metal, cloth, fiber, paper, rubber, leather, carbon, and a mirror.

It will be apparent to those skilled in the art that various modifications and variations can be made in the present disclosure without departing from the scope of the disclosures. Thus, it is intended that the claims cover the modifications and variations within the scope of this disclosure such that the claims are not limited by the disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a display panel including a plurality of pixels configured to display an image; and
a vibration device configured to vibrate the display panel;
a supporting member disposed at the rear surface of the display panel; and
a middle frame disposed between a rear periphery of the display panel and a front periphery of the supporting member,
wherein the vibration device is a piezoelectric device, comprising:
a piezoelectric layer having a plurality of grooves;
a first electrode layer on a first surface of the piezoelectric layer and in the plurality of grooves; and
a second electrode layer on a second surface of the piezoelectric layer,
wherein a contact area between the first electrode layer and the piezoelectric layer is greater than a contact area between the second electrode layer and the piezoelectric layer.

2. The display apparatus of claim 1, wherein the plurality of grooves of the piezoelectric device face the display panel.

3. The display apparatus of claim 2, further comprising:
a connection member between the first electrode layer and the display panel.

4. The display apparatus of claim 2, further comprising a plurality of spaces between the plurality of grooves and the display panel.

5. The display apparatus of claim 1, wherein each of the plurality of grooves is concave from a first surface of the piezoelectric layer.

6. The display apparatus of claim 1, wherein a part of the first electrode layer is accommodated on a first surface of the piezoelectric layer by the plurality of grooves.

7. The display apparatus of claim 1, wherein each of the plurality of grooves comprises a polygonal-shaped cross-sectional structure, a curved cross-sectional structure, or a dome-shaped cross-sectional structure.

8. The display apparatus of claim 1, wherein the piezoelectric layer comprises a first surface facing the first electrode layer and a second surface facing the second electrode layer, and
wherein the plurality of grooves are between the first surface of the piezoelectric layer and the first electrode layer.

9. The display apparatus of claim 1, wherein a width and a height of each of the plurality of grooves are in the range of 10 µm to 30 µm.

10. The display apparatus of claim 1, wherein a height of each of the plurality of grooves ranges from 10% to 12% of a thickness of the piezoelectric layer.

11. The display apparatus of claim 1, wherein the first electrode layer covers each of the plurality of grooves.

12. The display apparatus of claim 11, wherein the first electrode layer has a cross-sectional shape corresponding to a cross-sectional shape of a first surface of the piezoelectric layer including the plurality of grooves.

* * * * *